(12) United States Patent
Matsumoto et al.

(10) Patent No.: US 8,130,608 B2
(45) Date of Patent: Mar. 6, 2012

(54) COUPLED RING OSCILLATOR AND METHOD FOR INITIALIZING THE SAME

(75) Inventors: Akinori Matsumoto, Osaka (JP); Shiro Sakiyama, Kyoto (JP); Shiro Dosho, Osaka (JP); Yusuke Tokunaga, Hyogo (JP); Takashi Morie, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/967,498

(22) Filed: Dec. 14, 2010

(65) Prior Publication Data

US 2011/0080821 A1 Apr. 7, 2011

Related U.S. Application Data

(63) Continuation of application No. PCT/JP2009/001007, filed on Mar. 5, 2009.

(30) Foreign Application Priority Data

Jul. 7, 2008 (JP) ................................. 2008-176828

(51) Int. Cl.
*G11B 7/00* (2006.01)
*H03K 3/03* (2006.01)

(52) U.S. Cl. .................... 369/47.48; 369/124.14; 331/57
(58) Field of Classification Search ............... 369/47.48, 369/47.28, 47.15, 47.23, 47.46, 124.13, 124.14; 331/57, 45, 46, 56; 702/89, 118, 126
See application file for complete search history.

(56) References Cited

U.S. PATENT DOCUMENTS

| | | | |
|---|---|---|---|
| 5,475,344 A | 12/1995 | Maneatis et al. |
| 5,592,126 A | 1/1997 | Boudewijns et al. |
| 5,592,127 A | 1/1997 | Mizuno |
| | (Continued) | |

FOREIGN PATENT DOCUMENTS

JP 8-70239 3/1996
(Continued)

OTHER PUBLICATIONS

John G. Maneatis et al., "Precise Delay Generation Using Coupled Oscillators," IEEE Journal of Solid-State Circuits, vol. 28, No. 12, Dec. 1993, pp. 1273-1283.

*Primary Examiner* — Nabil Hindi
(74) *Attorney, Agent, or Firm* — McDermott Will & Emery LLP

(57) ABSTRACT

In a coupled ring oscillator including q ring oscillators each including p inverter circuits connected together to form a ring shape, and a phase coupling ring including (p×q) phase coupling circuits each of which is configured to couple an output of one of the p inverter circuits of one of the q ring oscillators to an output of one of the p inverter circuits of another one of the q ring oscillators in a predetermined phase relationship, and which are connected together to form a ring shape, for at least one group made up of one of the p inverter circuits in each of the q ring oscillators, outputs of the q inverter circuits belonging to the at least one group are fixed in phase with one another, the q ring oscillators are caused to oscillate in the in-phase fixed state, and then, the outputs of the q inverter circuits are released from the in-phase fixed state.

26 Claims, 13 Drawing Sheets

U.S. PATENT DOCUMENTS

| | | |
|---|---|---|
| 5,717,362 A | 2/1998 | Maneatis et al. |
| 6,025,756 A | 2/2000 | Miyabe |
| 6,683,503 B2 | 1/2004 | Mizuno et al. |
| 7,777,580 B2 * | 8/2010 | Dosho et al. .................... 331/57 |
| 2006/0049879 A1 | 3/2006 | Chiang |
| 2009/0261911 A1 | 10/2009 | Watanabe et al. |

FOREIGN PATENT DOCUMENTS

| | | |
|---|---|---|
| JP | 11-068522 | 3/1999 |
| JP | 2000-156629 | 6/2000 |
| WO | WO 2007/063965 A1 | 6/2007 |

* cited by examiner

COUPLED RING OSCILLATOR AND METHOD FOR INITIALIZING THE SAME

CROSS-REFERENCE TO RELATED APPLICATION

This is a continuation of PCT International Application PCT/JP2009/001007 filed on Mar. 5, 2009, which claims priority to Japanese Patent Application No. 2008-176828 filed on Jul. 7, 2008. The disclosures of these applications including the specifications, the drawings, and the claims are hereby incorporated by reference in their entirety.

BACKGROUND

The present disclosure relates to a coupled ring oscillator which is capable of producing a highly accurate fine phase using a plurality of ring oscillators.

To record information on an optical disc medium such as a digital versatile disc (DVD), a Blu-ray Disc (BD), and the like, it is necessary to generate a specific write waveform for reducing interference of a write signal. Generation of such a specific write waveform requires a highly accurate fine phase, and more specifically, a fine phase equal to or finer than one-fortieth of a write data rate is necessary. However, it is difficult to realize such very fine phase accuracy by a single inverter chain (a ring oscillator), because a phase delay thereof is smaller than a delay of a single inverter circuit.

Therefore, conventionally, a finer phase than a phase generable by a single ring oscillator is generated using a plurality of ring oscillators, specifically, by connecting inverter circuits in the plurality of ring oscillators together by phase coupling circuits so that an output phase of each of the ring oscillators is slightly shifted. As another example, a resistance ring in which a plurality of resistors are connected, and connection nodes of the resistors in the resistance ring are connected to connections nodes of phase delay elements in a plurality of ring oscillators, thereby generating a fine phase.

In the above-described coupled ring oscillator including a plurality of ring oscillators and a phase coupling ring comprised of phase coupling circuits each of which couples output phases of inverter circuits between the ring oscillators, the phase coupling ring is electrically disconnected at arbitrary parts to cause the ring oscillators to oscillate in a state where coupling of the output phases of the inverter circuits is weakened between different ring oscillators, and then, the phase coupling ring is closed again, thereby performing initialization.

The prevent inventors have found the following fact. A coupled ring oscillator has the same number of different oscillation states as the number of ring oscillators provided in the coupled ring oscillator. When the coupled ring oscillator falls into an undesired abnormal oscillation state, the oscillation frequency is reduced, and thus, a fine phase cannot be obtained. This mechanism will be hereinafter described.

FIG. 13 is a diagram illustrating a typical configuration of a conventional coupled ring oscillator. The coupled ring oscillator includes three ring oscillators 10 and a single phase coupling ring 20. Each of the ring oscillators 10 includes three inverter circuits 11 which are coupled together to form a ring shape. The phase coupling ring 20 includes the same number of phase coupling circuits 21 as the total number of the inverter circuits 11, i.e., nine phase coupling circuits 21, which are coupled together to form a ring shape. Each of the phase coupling circuits 21 couples an output of one of the inverter circuits 11 in one of the ring oscillators 10 to an output of one of the inverter circuits 11 in another one of the ring oscillators 10 in phase or in reverse phase with respect to one another. Then, outputs P1-P9 of the ring oscillators 10 serve as outputs of the coupled ring oscillator. Each ring oscillator 10 can generate only the same number of phases as the number of the inverter circuits 11 provided in the ring oscillator 10 (e.g., three in the example of FIG. 13). However, when being combined, a plurality of the ring oscillators 10 can generate more phases (e.g., nine in the example of FIG. 13). For convenience, it is assumed that each of the phase coupling circuits 21 is an inverter circuit, the following description will be given.

When a signal passes through one of the phase coupling circuits 21, a phase is delayed by an angle obtained by adding $\theta$ which is an internal delay of the phase coupling circuit 21 (e.g., a time required for an electron passes through the inside of a transistor, and the like) to 180° caused by logic inversion. That is, a phase difference $\phi$ (which will be hereinafter referred to as a "phase coupling angle") between two points coupled by a single one of the phase coupling circuits 21 is expressed by:

$$\phi = 180 + \theta$$

In the coupled ring oscillator, adjacent outputs (e.g., the outputs P1 and P2) are coupled via two of the phase coupling circuits 21, and thus, a phase difference between the adjacent outputs is 2×(180+θ). Since a phase difference of 360° can be considered as 0°, the phase difference between the adjacent outputs is 2θ. Considering the symmetry of the circuit, a phase difference between any adjacent two of the outputs is 2θ, which is a minimum phase difference that the coupled ring oscillator can generate. When the coupled ring oscillator is in a stable state, a phase of each output is returned to its original phase with one cycle delay (i.e., 360°) due to the periodicity of the phase. Therefore, the minimum phase difference 2θ of the coupled ring oscillator of FIG. 13 is 40°, which is one ninth of 360°. Assuming that p is the number of the inverter circuits 11 in each of the ring oscillators 10, and q is the number of the ring oscillators 10, when θ is generalized, θ can be expressed by following equation:

$$\theta = 180/pq$$

The smaller the internal delay $\theta$ of the phase coupling circuit 21 is, i.e., the smaller the phase coupling angle $\phi$ is, the more stable state of the coupled ring oscillator can be obtained. When the phase coupling circuit 21 is an inverter circuit, the minimum value of the phase coupling angle $\phi$ is 180°. When each of the ring oscillators is configured to include four stages of single-ended inverter circuits, the phase coupling angle $\phi$ is maximum, i.e., 270°. Therefore, it is presumed that, when 180<$\phi$≦270°, the coupled ring oscillator stably oscillates. It is also presumed that, when the phase coupling angle $\phi$ is out of the range indicated above, the coupled ring oscillator falls into an abnormal oscillation state.

Next, a general expression for the phase coupling angle $\phi$ is derived. For convenience, each of p and q is an odd number. First, the minimum value $\phi_{min}$ of the phase coupling angle $\phi$ is expressed by the following equation:

$$\phi_{min} = 180 + 180/pq$$

The phase difference between the outputs of two of the inverter circuits 11 connected together in each of the ring oscillators 10 (e.g., the outputs P1 and P7 in the example of FIG. 13) is q times of the phase coupling angle $\phi$ (i.e., q$\phi$), since a signal passes through q phase coupling circuits 21 in the phase coupling ring 20. Then, based on the above, $$q\varphi = q\varphi_{min} + 360n$$
$$= q(180 + 180/pq) + 360n$$
$$= 180(q + 1/p + 2n)$$

Note that n is an integer of 0 or greater, and 360n is a phase delay determined in consideration of the periodicity of the phase. Therefore, the phase coupling angle φ is expressed by the following general expression:

$$\phi=180(pq+1+2np)/pq$$

Furthermore, when m=(pq+1+2np)/2, the above-indicated general expression can be changed to:

$$\phi=360m/pq$$

This shows that the phase coupling angle φ corresponds to the output phase of one of the inverter circuits 11 in one of the ring oscillators 10. That is, the phase coupling circuit 21 might couple the outputs of two of the inverter circuits 11 together with an unintended phase coupling angle φ, and thus, the oscillation operation of the coupled ring oscillator might be stabilized in the unintended phase coupled state.

In the coupled ring oscillator of FIG. 13, a phase coupling angle φ relative to n and a phase difference Δφ between the inverter circuit 11 and the phase coupling circuit 21 are as follows. Note that, assuming that a phase difference between input and output of the inverter circuit 11 is θ', Δφ is defined as Δφ=360−(θ'+φ). As shown in FIG. 13, in the ring oscillator 10 including three inverter circuits 11 coupled together to form a ring shape, θ'=120.

| n | φ | Δφ |
|---|---|---|
| 0 | 200 | 40 |
| 1 | 320 | −80 |
| 2 | 440 (=80) | 160 |
| 3 | 560 (=200) | 40 |
| 4 | 680 (=320) | −80 |

Here, when n≧3, the same state is held as a state where there is a remainder when n is divided by 3. Based on this, it is understood that the coupled ring oscillator of FIG. 13 has three coupled states or oscillation states. The phase difference Δφ is 40°, when n=0. Also, the phase difference Δφ is −80° when n=1, and is 160° when n=2. That is, the phase difference Δφ greatly differs according to the state of the coupled ring oscillator. When an absolute value of the phase difference Δφ is large, a logic collision between the H level and the L level occurs between the ring oscillator 10 and the phase coupling ring 20, and a through current flows, so that the slew rate of an output signal is reduced. As a result, the oscillation frequency of the coupled ring oscillator is reduced. Therefore, to generate a fine phase by the coupled ring oscillator, in other words, to cause the coupled ring oscillator to oscillate at a high frequency, the absolute value of the phase difference Δφ is preferably set to be as small as possible.

In general, a coupled ring oscillator including q ring oscillators has q oscillation states. Normally, the phase coupling angle φ is in the range from 180° to 270°, and thus, an abnormal oscillation state where n is 1 or larger is hardly caused. However, when, in order to obtain a finer phase, the number of inverter circuits provided in each ring oscillator is increased, or the number of ring oscillators provided in the coupled ring oscillator is increased, the number of unintended phase coupling states is increased accordingly, and thus, the risk that the coupled ring oscillator may fall into an abnormal oscillation state is increased. Specifically, when a great number of ring oscillators are provided, or when each of inverter circuits of the coupled ring oscillator has low drive capability, the phase coupling strength between the ring oscillators is reduced, and more phase errors are accumulated, so that the coupled ring oscillator possibly falls into an abnormal oscillation state. Once the coupled ring oscillator falls into an abnormal oscillation state, the coupled ring oscillator is stabilized in the abnormal oscillation state, and thus, the coupled ring oscillator cannot be recovered to a normal oscillation state. This problem cannot be solved by a conventional initialization method in which the phase coupling ring is electrically disconnected at arbitrary parts.

SUMMARY

The present invention may advantageously allow a coupled ring oscillator to oscillate in a normal oscillation state without causing the coupled ring oscillator to fall into an abnormal oscillation state, or a coupled ring oscillator which has been stabilized in an abnormal oscillation state to be recovered to a normal oscillation state.

For example, a method for initializing a coupled ring oscillator, the coupled ring oscillator including q ring oscillators each including p inverter circuits connected together to form a ring shape, where each of p and q is an integer of 2 or greater, and a phase coupling ring including (p×q) phase coupling circuits each of which is configured to couple an output of one of the p inverter circuits in one of the q ring oscillators to an output of one of the p inverter circuits in another one of the q ring oscillators in a predetermined phase relationship, and which are connected together to form a ring shape, and the method includes: fixing, for at least one group made up of selected one of the p inverter circuits in each of the q ring oscillators, outputs of the selected ones of the q inverter circuits belonging to the at least one group in phase with one another; causing the q ring oscillators to oscillate in the in-phase fixed state; and releasing, after causing the q ring oscillators to oscillate, the outputs of the q inverter circuits are released from the in-phase fixed state (see FIG. 1).

Thus, when starting or resetting the coupled ring oscillator, first, the phase relationship of outputs of inverter circuits in each of the ring oscillators is forced to be equal for all of the ring oscillators. This operation is called "phase equalization." Phase equalization may be performed to one of the inverter circuits in each of the ring oscillators or all of the inverter circuits. Even when outputs of the inverter circuits are coupled via the phase coupling circuit, the relationship between the outputs of the inverter circuits is forced to be fixed in phase with one another by phase equalization. That is, the phase coupling strength between the ring oscillators is reduced. Then, in a state where phase equalization has been performed, all of the ring oscillators are caused to oscillate. Phase equalization may be performed in a state where each of the ring oscillators is in operation. Thus, in any cases, all of the ring oscillators are caused to oscillate in the same phase relationship. Thereafter, when phase equalization is released, the phase of an output of each of the inverter circuits can freely move, and shortly thereafter, the phases are coupled by the phase coupling circuits, so that the coupled ring oscillator is in the above-described state of n=0, i.e., in a normal oscillation state where the phase difference Δφ is minimum.

Therefore, even when the number of the ring oscillators is large, or the drive capability of each of the inverter circuits provided in each of the phase coupling circuits is low, the coupled ring oscillator can be caused to oscillate in a normal oscillation state without falling into an abnormal oscillation state, or the coupled ring oscillator which has been stabilized in an abnormal oscillation state can be recovered to a normal oscillation state.

As a coupled ring oscillator which can perform the above-described initialization, a coupled ring oscillator includes: q ring oscillators each including p inverter circuits connected together to form a ring shape, where each of p and q is an integer of 2 or greater; a phase coupling ring including (p×q) phase coupling circuits each of which is configured to couple an output of one of the p inverter circuits in one of the q ring oscillators to an output of one of the p inverter circuits in another one of the q ring oscillators in a predetermined phase relationship, and which are connected together to form a ring shape; and a switching circuit configured to switch between a short circuit state and an open-circuit state between an output of one of the p inverter circuits in each of the q ring oscillators and an output of one of the p inverter circuits in an associated one of the q ring oscillators.

Thus, the outputs of the plurality of inverter circuits are short-circuited together, so that the outputs can be forced to be fixed in phase with one another. Also, the in-phase fixed state of the outputs of the inverter circuits can be released by releasing the short circuit state. Thus, the above-described initialization can be executed.

Preferably, the switching circuit is provided for each of the p inverter circuits in each of the q ring oscillators, and the coupled ring oscillator further includes p off-state switching elements provided so that one of the p off-state switching elements is arranged between any two of the p switching circuits. Thus, the symmetry of the circuit of the coupled ring oscillator is maintained, so that a highly accurate fine phase can be generated.

Specifically, the switching circuit includes (q−1) switching elements configured to perform an identical open/close operation, and each of the (q−1) switching elements is provided between an output of one of the p inverter circuits in one of the q ring oscillators and an output of one of the p inverter circuits in another one of the q ring oscillators. As another alternative, the switching circuit includes q switching elements configured to perform an identical open/close operation, and each of the q switching elements is provided between an output of one of the p inverter circuits in each of the q ring oscillators and a common voltage node which is provided for the switching circuit. Preferably, the coupled ring oscillator further includes: a plurality of off-state switching elements each being provided between an output of one of the p inverter circuits in each of the q ring oscillators in which the switching circuit is not provided and the common voltage node. Thus, the symmetry of the circuit of the coupled ring oscillator is maintained, so that a highly accurate fine phase can be generated.

As another coupled ring oscillator which can perform the above-described initialization, a coupled ring oscillator includes: q ring oscillators each including p inverter circuits connected together to form a ring shape, where each of p and q is an integer of 2 or greater; and a phase coupling ring including p first phase coupling circuits and (p×(q−1)) second phase coupling circuits, each of which is configured to couple an output of one of the p inverter circuits in one of the q ring oscillators to an output of one of the p inverter circuits in another one of the q ring oscillators in phase with one another, and which are connected together to form a ring shape so that one of the first coupling circuits is inserted after every (q−1) of the second phase coupling circuits, and each of the p first phase coupling circuits is configured so that an impedance of each of the p first phase coupling circuits can be switched between a normal impedance and a high impedance.

Thus, by switching the impedance of the first phase coupling circuit to a high impedance, the outputs of the plurality of inverter circuits can be forced to be fixed in phase with one another by the second phase coupling circuit. Also, the in-phase fixed state of the outputs of the inverter circuits can be released by switching the impedance of the first phase coupling circuit to a normal impedance. Thus, the above-described initialization can be executed.

Specifically, each of the p first phase coupling circuits includes a resistive element, and a switching element whose one end is connected to one end of the resistive element, and the switching elements of the p first phase coupling circuits perform an identical open/close operation. Preferably, each of the (p×(q−1)) second phase coupling circuits includes a resistive element, and an on-state switching element connected to one end of the resistive element. Thus, the symmetry of the circuit of the coupled ring oscillator is maintained, so that a highly accurate fine phase can be generated.

Each of the p first phase coupling circuits may further include a switching element which is connected to the other end of the resistive element and performs an identical open/close operation to that of the switching element connected to the one of the resistive element. Preferably, each of the (p×(q−1)) second phase coupling circuits includes a resistive element, and on-state switching elements each being connected to one of both ends of the resistive element. Thus, the symmetry of the circuit of the coupled ring oscillator is maintained, so that a highly accurate fine phase can be generated.

As another alternative, specifically, each of the p first phase coupling circuits includes a switching element, and resistive elements each being connected to one of both ends of the switching element, and the switching elements in the p first phase coupling circuits perform an identical open/close operation. Preferably, each of the (p×(q−1)) second phase coupling circuits includes an on-state switching element, and resistive elements each being connected to one of both ends of the on-state switching element. Thus, the symmetry of the circuit is maintained, so that a highly accurate fine phase can be generated.

DETAILED DESCRIPTION

Figure 1:
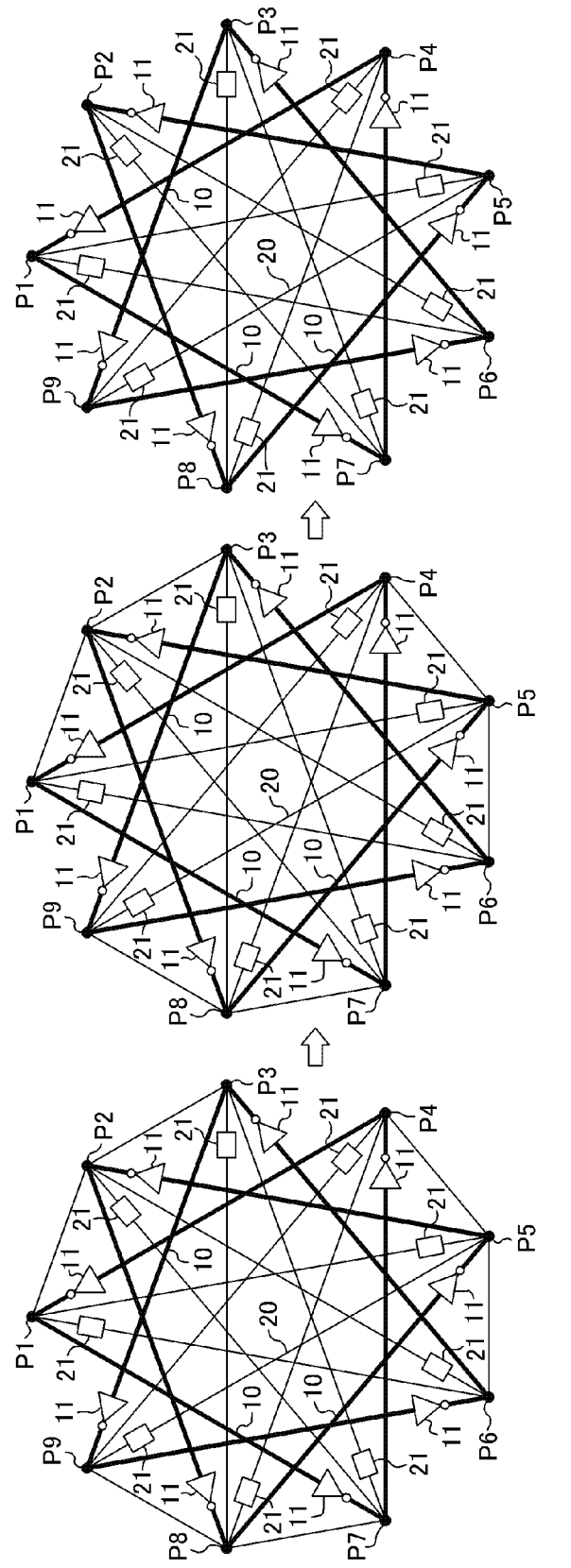
FIG. 1 is a diagram illustrating procedures for initializing a coupled ring oscillator.

Embodiments of the present invention will be hereinafter described with reference to the accompanying drawings. Note that each component having a similar function is identified by the same reference character throughout the following embodiments, and the description thereof is not repeated.

<<First Embodiment>>

Figure 2:
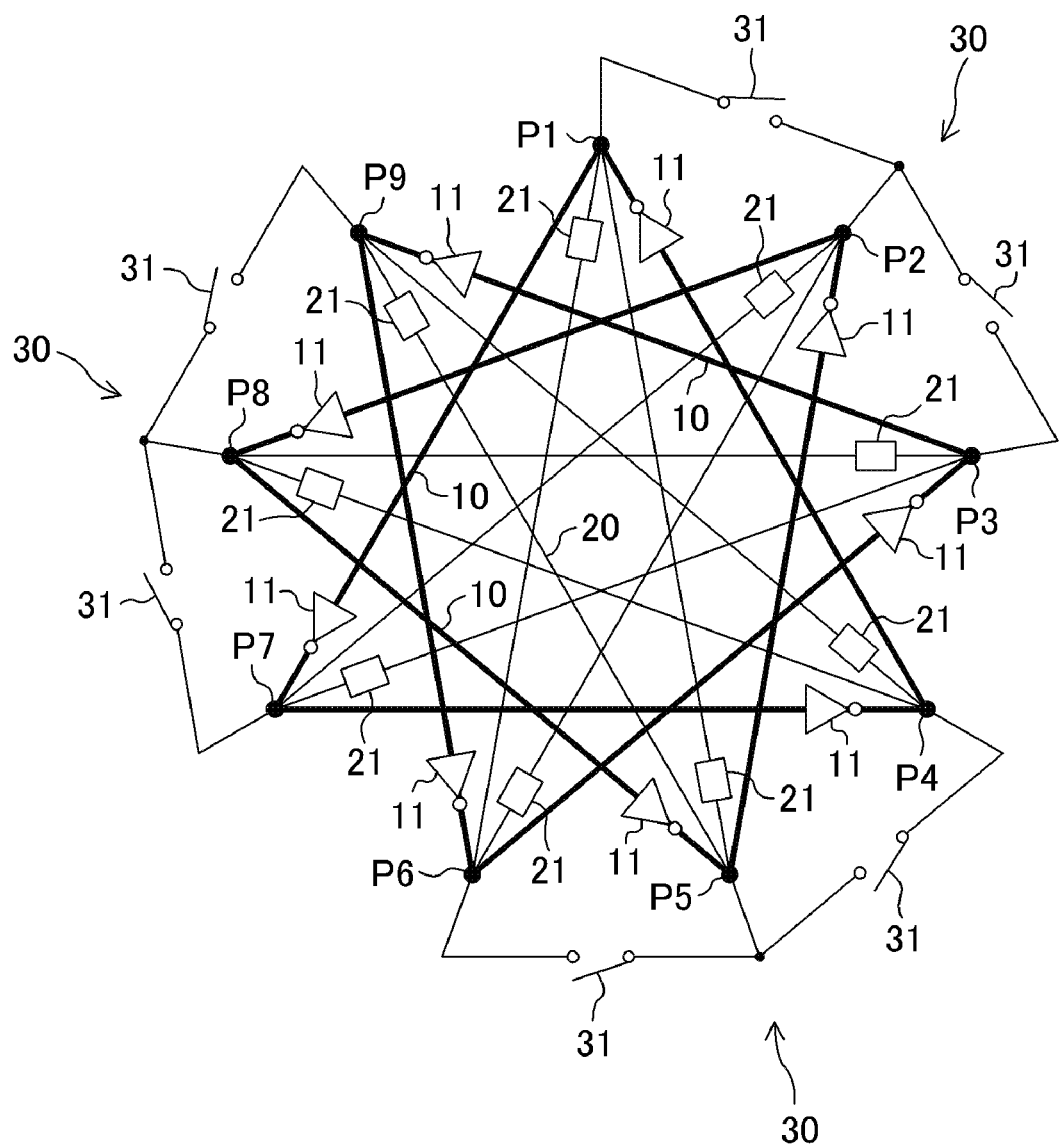
FIG. 2 is a diagram illustrating a configuration of a coupled ring oscillator according to a first embodiment.
Figure 13:
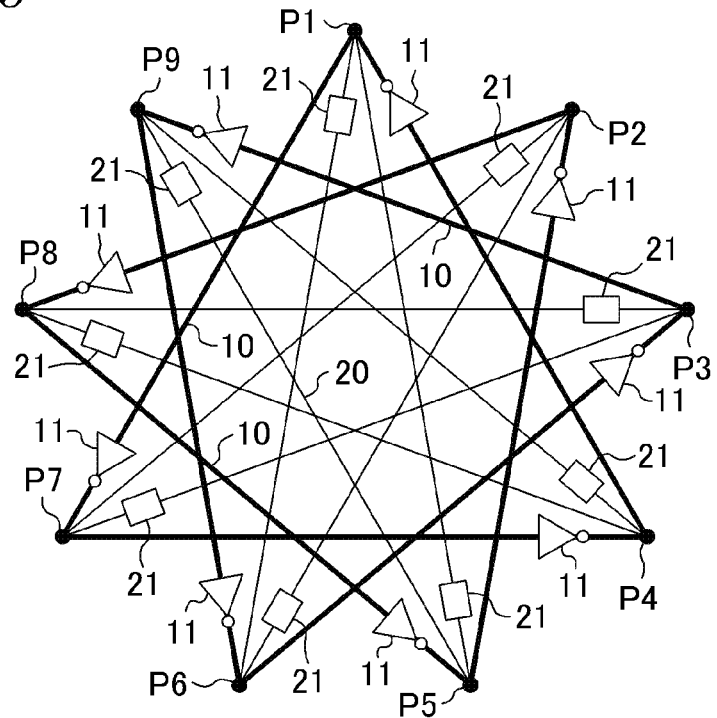
FIG. 13 is a diagram illustrating a configuration of a conventional coupled ring oscillator.

FIG. 2 is a diagram illustrating a configuration of a coupled ring oscillator according to a first embodiment. The coupled ring oscillator of this embodiment is obtained by adding three switching circuits 30 to the coupled ring oscillator of FIG. 13. Each of the switching circuits 30 includes two switching elements 31 which perform an identical open/close operation. Each of the switching elements 31 is provided between an output of one of inverter circuits 11 in one of ring oscillators 10 and an output of one of inverter circuits 11 in another one of the ring oscillators 10 (e.g., between an output P1 and an output P2).

When the two switching elements 31 in each of the switching circuits 30 are put into a conductive state, the output of one of inverter circuits 11 in one of the ring oscillators 10 and the output of one of inverter circuits 11 in another of the ring oscillators 10 are short-circuited together, and are forced to be fixed in phase with one another. When the two switching elements 31 in each of the switching circuits 30 are put into a non-conductive state, the short circuit of the outputs is released. When the short circuit of the outputs of the inverter circuits 11 is released, the outputs of the inverter circuits 11 are phase-coupled together by an associated one of phase coupling circuits 21 in a phase coupling ring 20.

The coupled ring oscillator of this embodiment is started or restarted in the following manner. First, the two switching elements 31 in each of the switching circuits 30 are put into a conductive state to cause each of the ring oscillators 10 to oscillate. Thereafter, the switching elements 31 are put into a non-conductive state. Thus, the coupled ring oscillator can be caused to oscillate in a normal oscillation state without falling into an abnormal oscillation state, or the coupled ring oscillator which has been stabilized in an abnormal oscillation state can be recovered to a normal oscillation state.

Note that even when the coupled ring oscillator is configured to include only a single switching circuit 30, similar advantages can be achieved. However, it is preferable that, as in the example of FIG. 2, a switching circuit 30 is provided for each of the inverter circuits 11 in each of the ring oscillators 10. Thus, at a start of initialization of the coupled ring oscillator, the ring oscillators 10 can be caused to be in the same oscillation state in a shorter time.

The configuration of the switching circuits 30 is not limited to the example of FIG. 2. For example, the switching element 31 may be provided between the output P1 and the output P3, not between the output P1 and the output P2, or may be provided between the output P1 and the output P3, not between the output P2 and the output P3.

<<Second Embodiment>>

Figure 3:
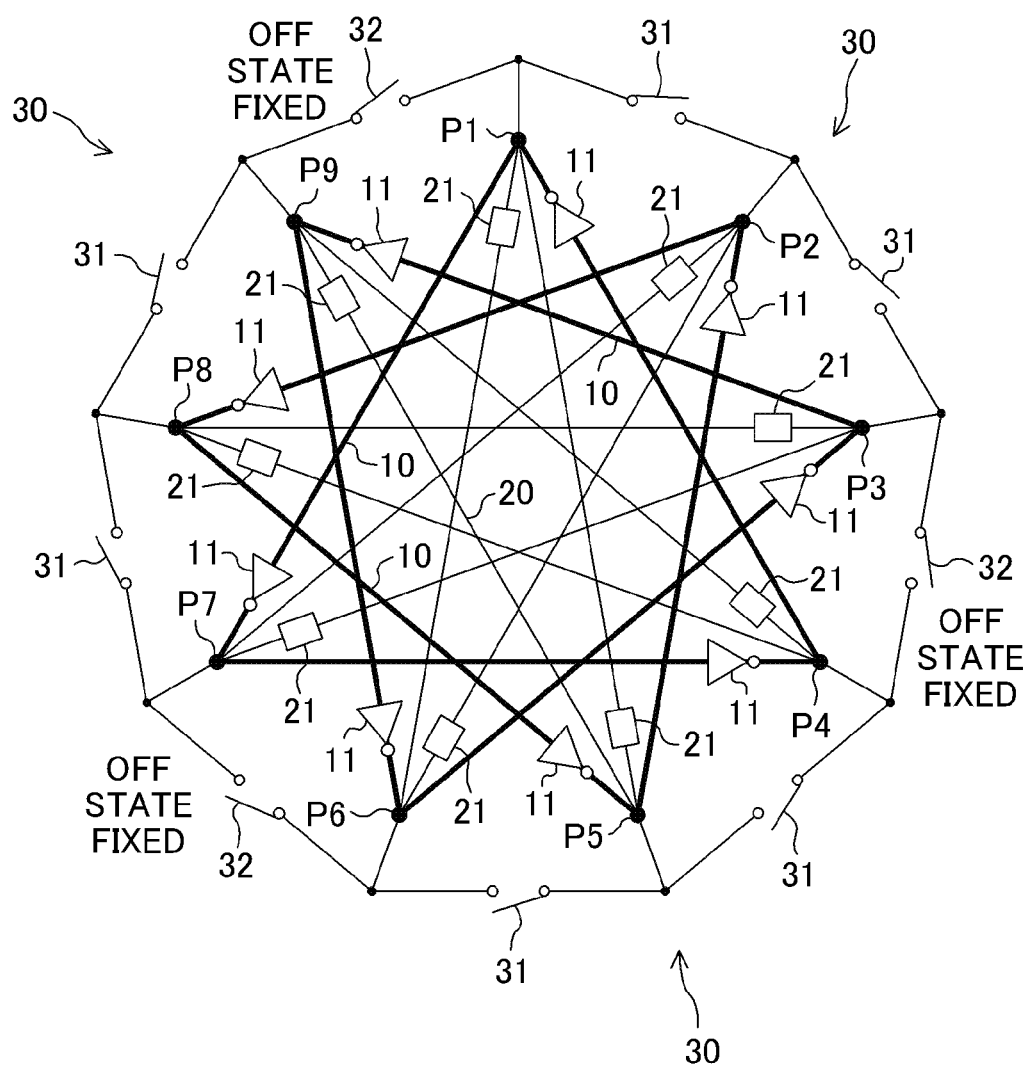
FIG. 3 is a diagram illustrating a configuration of a coupled ring oscillator according to a second embodiment.

FIG. 3 is a diagram illustrating a configuration of a coupled ring oscillator according to a second embodiment. The coupled ring oscillator of this embodiment is obtained by adding three off-state switching elements 32, each of which is provided between one of the switching circuits 30 and another one of the switching circuits 30, to the coupled ring oscillator of FIG. 2.

Each of the switching elements 31 is normally a transistor. When the switching element 31 is connected to the coupled ring oscillator, for example, a parasitic capacitance of the transistor is applied between the outputs P1 and P2, but a parasitic capacitance is not applied between the outputs P1 and P9, so that the symmetry of the circuit is lost. In such a case, the oscillation phase of each of the ring oscillators 10 cannot be accurately divided into equal portions, thus resulting in reduction in phase accuracy. Therefore, the off-state switching elements 32 are provided as dummy switches at parts where no switching element 31 is provided. Thus, the symmetry of the circuit is maintained, so that a highly accurate fine phase can be generated.

<<Third Embodiment>>

Figure 4:
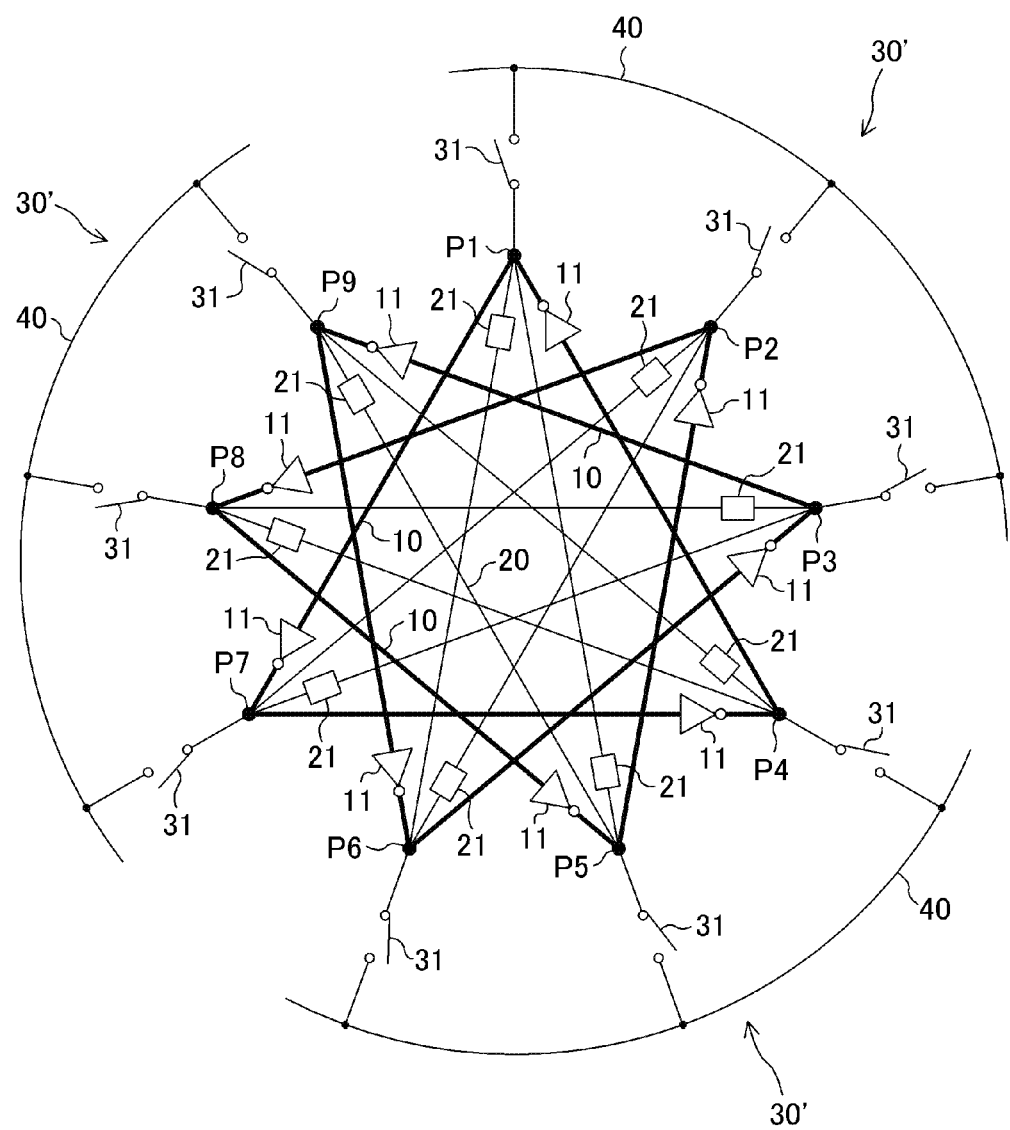
FIG. 4 is a diagram illustrating a configuration of a coupled ring oscillator according to a third embodiment.
Figure 5:
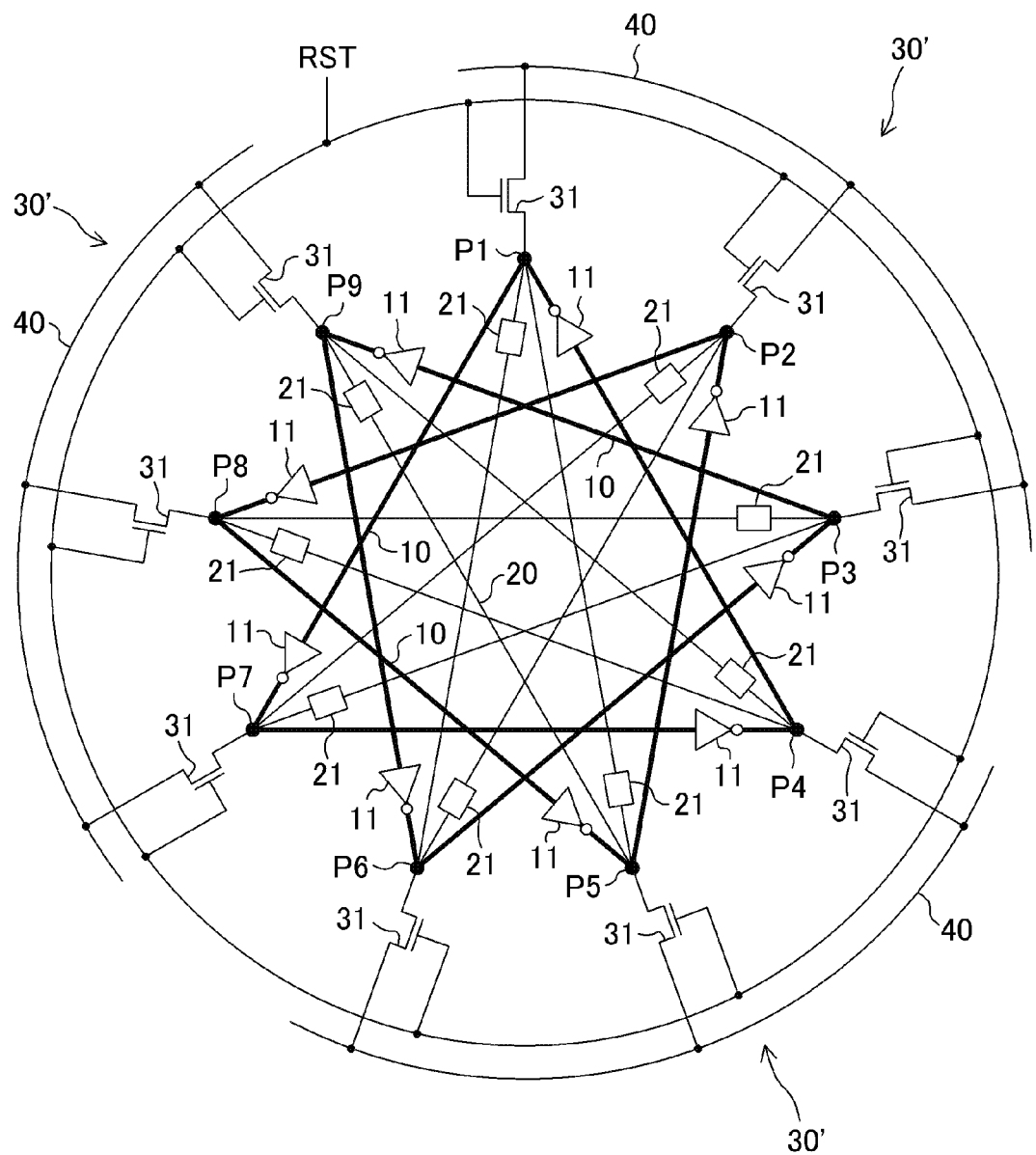
FIG. 5 is a circuit diagram illustrating a specific configuration of the coupled ring oscillator of FIG. 4.

FIG. 4 is a diagram illustrating a configuration of a coupled ring oscillator according to a third embodiment. The coupled ring oscillator of this embodiment is obtained by adding three switching circuits 30' to the coupled ring oscillator of FIG. 13. Each of the switching circuits 30' includes three switching elements 31 which perform an identical open/close operation. Each of the switching elements 31 is provided between an output of one of inverter circuits 11 in each of ring oscillators 10 and an associated one of common voltage nodes 40 each being provided for an associated one of the switching circuits 30'. Specifically, the switching element 31 can be comprised of an nMOS transistor in which a reset signal RST is applied to a gate thereof (see FIG. 5). Note that one of the three common voltage nodes 40 may be fixed to a ground potential or a power supply potential. Thus, the three ring oscillators 10 can be forced to be in the same oscillation state.

When the three switching elements 31 in each of the switching circuits 30' are put into a conductive state, an output of one of inverter circuits 11 in one of the ring oscillators 10 and an output of one of inverter circuits 11 in another one of the ring oscillators 10 are short-circuited together, and are forced to be fixed in phase in one another. When the three switching elements 31 in each of the switching circuits 30' are put into a non-conductive state, the short circuit of the outputs is released. When the short circuit of the outputs of the inverter circuits 11 is released, the outputs of the inverter circuits 11 are phase-coupled together by an associated one of phase coupling circuits 21 in a phase coupling ring 20.

The coupled ring oscillator of this embodiment is started or restarted in the following manner. First, the three switching elements 31 in each of the switching circuits 30' are put into a conductive state (the reset signal RST is caused to be "H" in the example of FIG. 5) to cause each of the ring oscillators 10 to oscillate. Thereafter, the switching elements 31 are put into a non-conductive state (the reset signal RST is caused to be "L" in the example of FIG. 5). Thus, the coupled ring oscillator can be caused to oscillate in a normal oscillation state without falling into an abnormal oscillation state, or the coupled ring oscillator which has been stabilized in an abnormal oscillation state can be recovered to a normal oscillation state.

Figure 6:
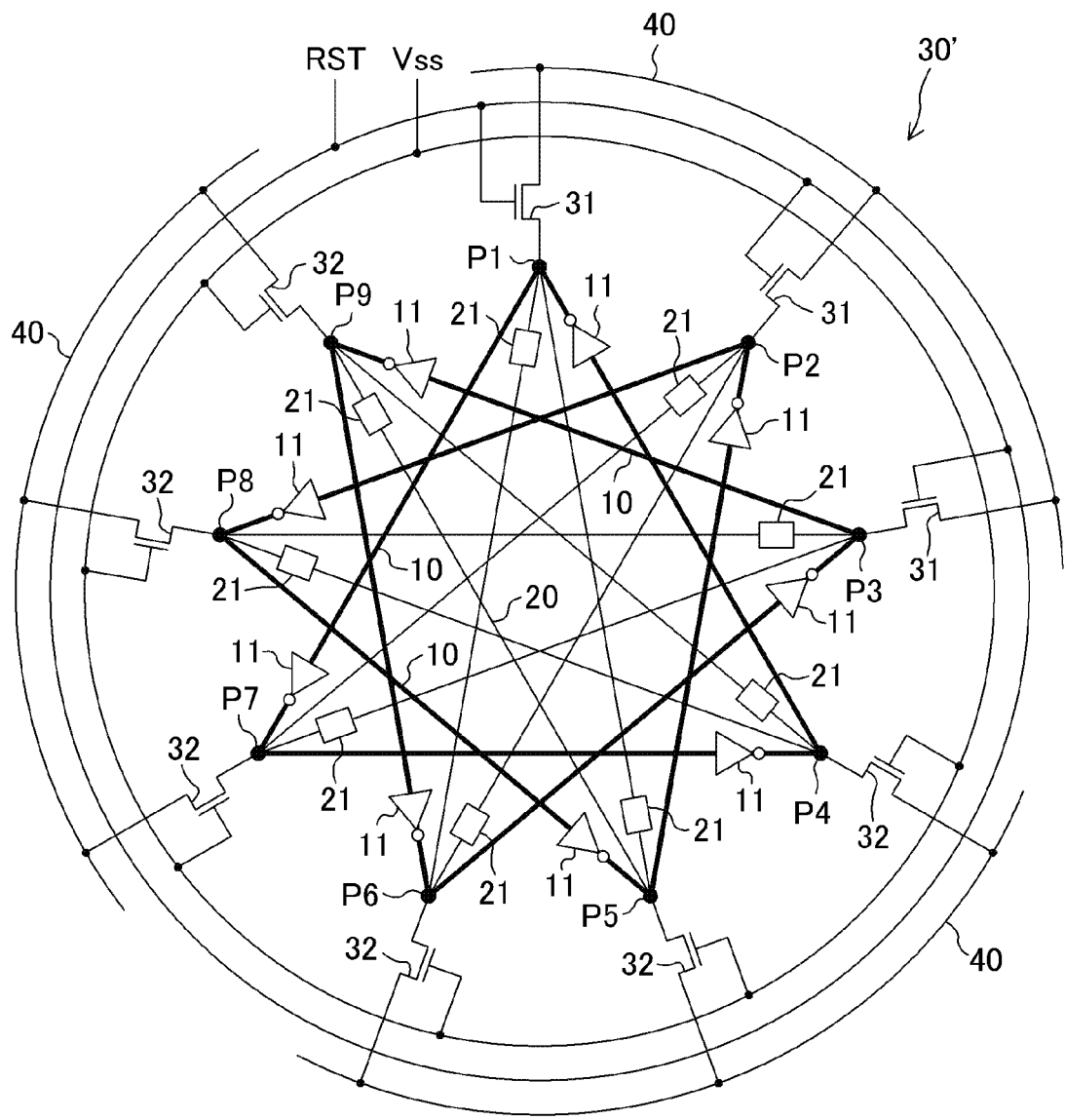
FIG. 6 is a diagram of a variation of FIG. 5.

Note that, similar to the above, even when only a single switching circuit 30' is provided, similar advantages can be achieved. In such a case, it is preferable that, in each of the other inverter circuits 11 in which the switching circuit 30' is not provided, an off-state switching element 32 is provided between an output of the inverter circuit 11 and an associated one of the common voltage nodes 40. Specifically, the switching element 32 can be comprised of an nMOS transistor in which a power supply potential Vss is applied to a gate thereof (see FIG. 6). Thus, the symmetry of the circuit is maintained, so that a highly accurate fine phase can be generated.

Figure 14:
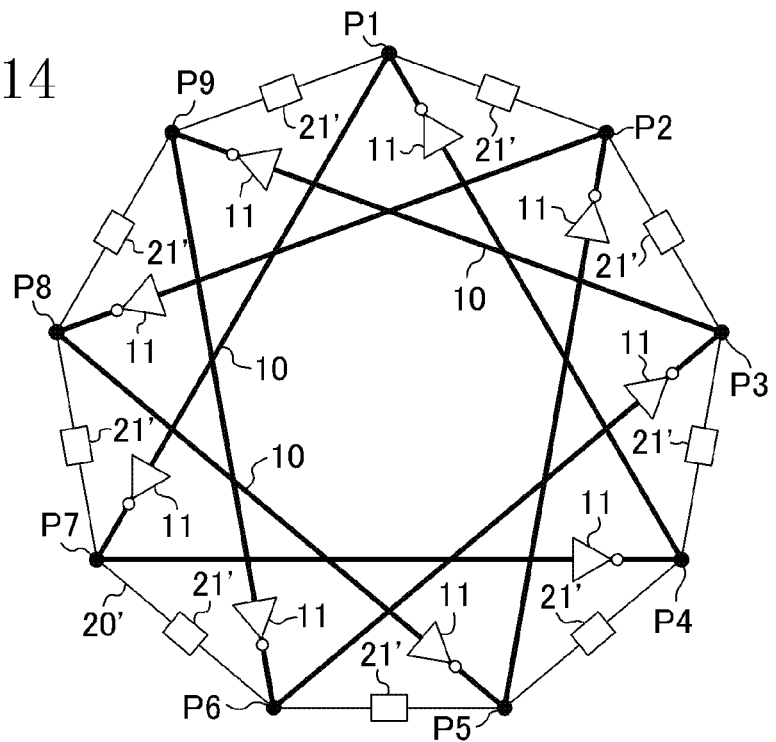
FIG. 14 is a diagram illustrating a configuration of a conventional coupled ring oscillator.

When a device which couples two points together in phase with one another (such as a resistive element, and the like) is employed as a phase coupling circuit, the coupled ring oscillator has a configuration of FIG. 14. The coupled ring oscillator of FIG. 14 is different from the coupled ring oscillator of FIG. 13, and includes a phase coupling ring 20' including nine phase coupling circuits 21' each of which couples two points in phase with one another and which are connected together to form a ring shape. Thus, the coupled ring oscillator of FIG. 14 can also generate a fine phase. Furthermore, the coupled ring oscillator of FIG. 14 has an advantage over the coupled ring oscillator of FIG. 13 in the point that each of the phase coupling circuits 21' does not include an inverter circuit, and therefore, the design of the coupled ring oscillator can be simplified, and that an advantage resulting from averaging of output phase errors caused by resistor coupling can be achieved. Embodiments based on the coupled ring oscillator of FIG. 14 will be described below.

<<Fourth Embodiment>>

Figure 7:
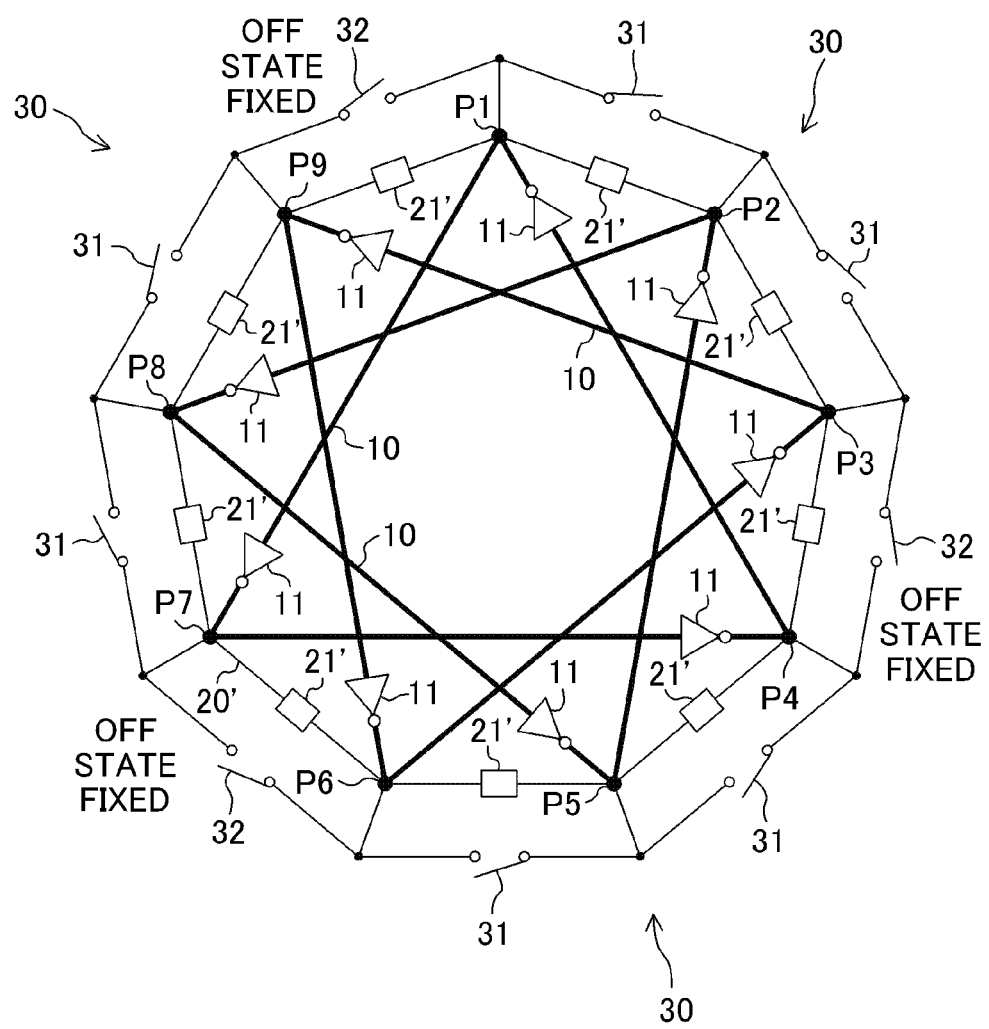
FIG. 7 is a diagram illustrating a configuration of a coupled ring oscillator according to a fourth embodiment.

FIG. 7 is a diagram illustrating a configuration of a coupled ring oscillator according to a fourth embodiment. The coupled ring oscillator of this embodiment is obtained by adding three switching circuits 30 and three off-state switching elements 32 to the coupled ring oscillator of FIG. 14, and corresponds to the coupled ring oscillator of the second embodiment. According to this embodiment, advantages similar to those of the second embodiment can be achieved.

Note that the three switching elements 32 can be omitted. Also, only a single switching circuit 30 may be provided.

<<Fifth Embodiment>>

Figure 8:
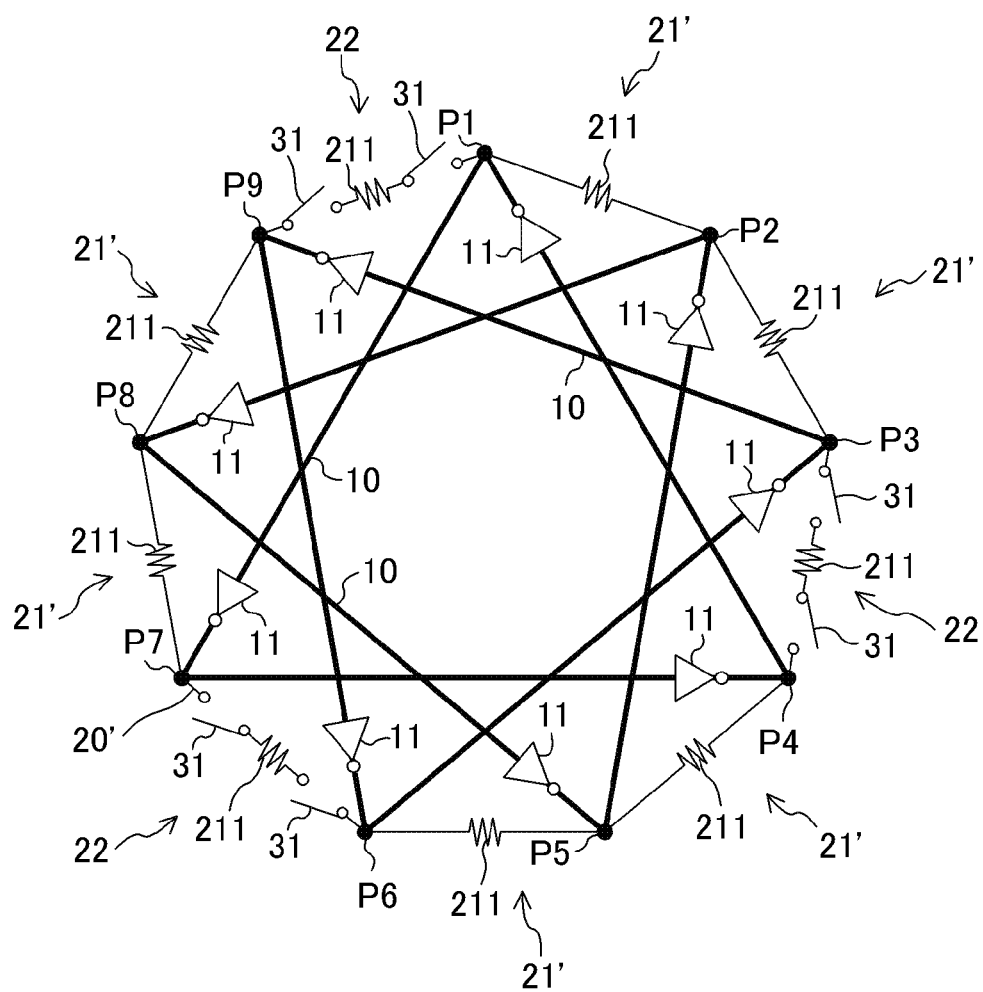
FIG. 8 is a diagram illustrating a configuration of a coupled ring oscillator according to a fifth embodiment.

FIG. 8 is a diagram illustrating a configuration of a coupled ring oscillator according to a fifth embodiment. The coupled ring oscillator of this embodiment includes a phase coupling ring 20' comprised of three phase coupling circuits 22 and six phase coupling circuits 21'. Each of the phase coupling circuits 21' is comprised of a single resistive element 211. Each of the phase coupling circuits 22 is comprised of a single resistive element 211 and two switching elements 31, each being connected to one of both ends of the resistive element 211. All of the switching elements 31 perform an identical open/close operation. The phase coupling ring 20' is configured so that one of the phase coupling circuits 22 is inserted after every two of the phase coupling circuits 21' and the phase coupling circuits 22 are arranged to form a ring shape as a whole.

When the two switching elements 31 in the phase coupling circuit 22 are put into a no-conductive state, the phase coupling circuit 22 has a high impedance, and the phase coupling strength between outputs of inverter circuits 11 each being connected to one of both ends of the phase coupling circuit 22 is reduced. On the other hand, outputs of the inverter circuits 11 each being connected to one of both ends of the phase coupling circuit 21' are maintained to be phase-coupled by the resistive element 211. Thus, the outputs of three of the inverter circuits 11 of two adjacent ones of the phase coupling circuits 21' are strongly coupled in phase with one another, so that a state corresponding to that in Step 1 of FIG. 1 can be achieved. That is, when the phase coupling ring 20' is electrically decoupled, each of the decoupled parts has similar results to those achieved when a short circuit is caused by a switching element.

The coupled ring oscillator of this embodiment is started or restarted in the following manner. First, the two switching elements 31 in each of the phase coupling circuits 22 are put into a non-conductive state to cause each of the ring oscillators 10 to oscillate. Thereafter, the switching elements 31 are put into a conductive state. Thus, the coupled ring oscillator can be caused to oscillate in a normal oscillation state without falling into an abnormal oscillation state, or the coupled ring oscillator which has been stabilized in an abnormal oscillation state can be recovered to a normal oscillation state.

Note that even when each of the phase coupling circuits 22 is configured to include only a single switching circuit 31, similar advantages can be achieved.

<<Sixth Embodiment>>

Figure 9:
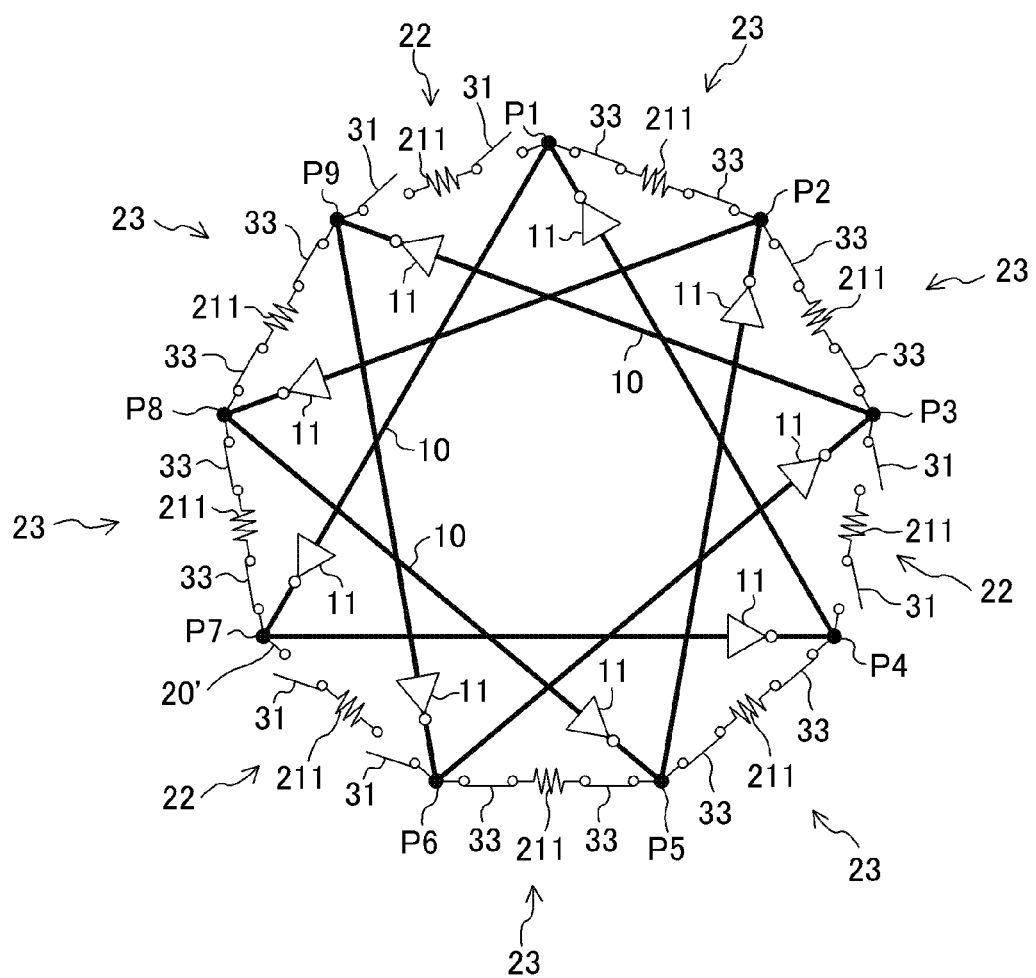
FIG. 9 is a diagram illustrating a configuration of a coupled ring oscillator according to a sixth embodiment.

FIG. 9 is a diagram illustrating a configuration of a coupled ring oscillator according to a sixth embodiment. The coupled ring oscillator of this embodiment is obtained by replacing all of the phase coupling circuits 21' in the coupled ring oscillator of the fifth embodiment (see FIG. 8) with phase coupling circuits 23. Only differences of this embodiment from the fifth embodiment will be hereinafter described.

Each of the phase coupling circuits 23 includes a single resistive element 211 and two on-state switching elements 33 each being connected to one of both ends of the resistive element 211. That is, each of the phase coupling circuits 23 has the same circuit configuration as that of the phase coupling circuit 22, except that the two switching elements 33 are fixed in an on state. As described above, the symmetry of the circuit is maintained by inserting the on-state switching elements 33 as dummy switches, so that a highly accurate fine phase can be generated.

Note that even when each of the phase coupling circuits 22 is configured to include only a single switching element 31, and each of the phase coupling circuits 23 is configured to include only a single switching element 33, similar advantages can be achieved.

<<Seventh Embodiment>>

Figure 10:
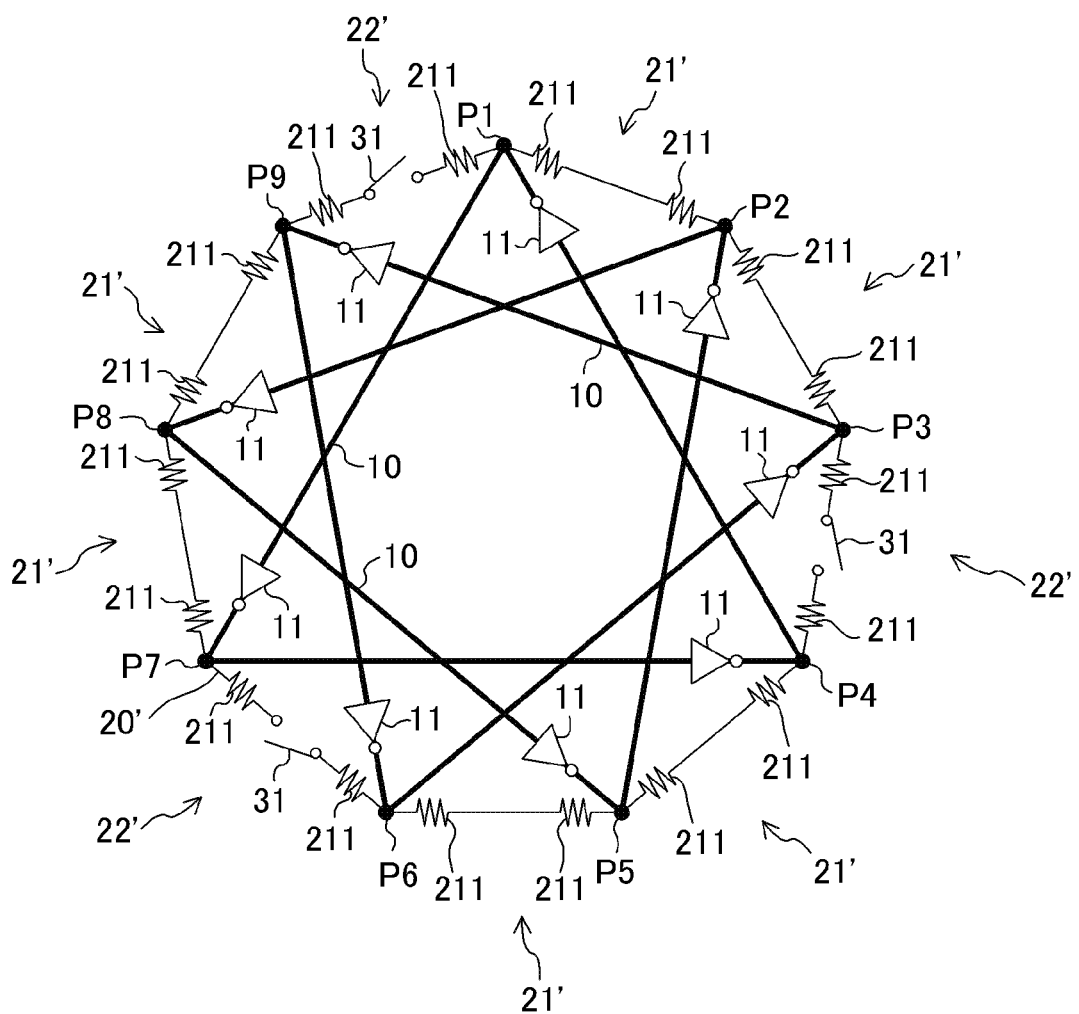
FIG. 10 is a diagram illustrating a configuration of a coupled ring oscillator according to a seventh embodiment.

FIG. 10 is a diagram illustrating a coupled ring oscillator according to a seventh embodiment. The coupled ring oscillator of this embodiment includes a phase coupling ring 20' comprised of three phase coupling circuits 22' and six phase coupling circuits 21'. Each of the phase coupling circuits 21' includes two resistive elements 211 connected together in series. Each of the phase coupling circuits 22' includes a single switching element 31 and two resistive elements 211 each being connected to one of both ends of the resistive element 211. All of the switching elements 31 perform an identical open/close operation. The phase coupling ring 20' is configured so that one of the phase coupling circuits 22' is inserted after every two of the phase coupling circuits 21' and the phase coupling circuits 22' are arranged to form a ring shape as a whole.

According to this embodiment, the number of the switching elements 31 to be inserted in the phase coupling ring 20' can be reduced, compared to the fifth embodiment. Thus, a signal delay due to a parasitic capacitance of each of transistors of the switching elements 31 is reduced, so that a signal travels through the phase coupling ring 20' at high speed, and a more accurate fine phase can be generated.

Note that even when each of the phase coupling circuits 22' is configured to include only a single resistive element 211, similar advantages can be achieved.

<<Eighth Embodiment>>

Figure 11:
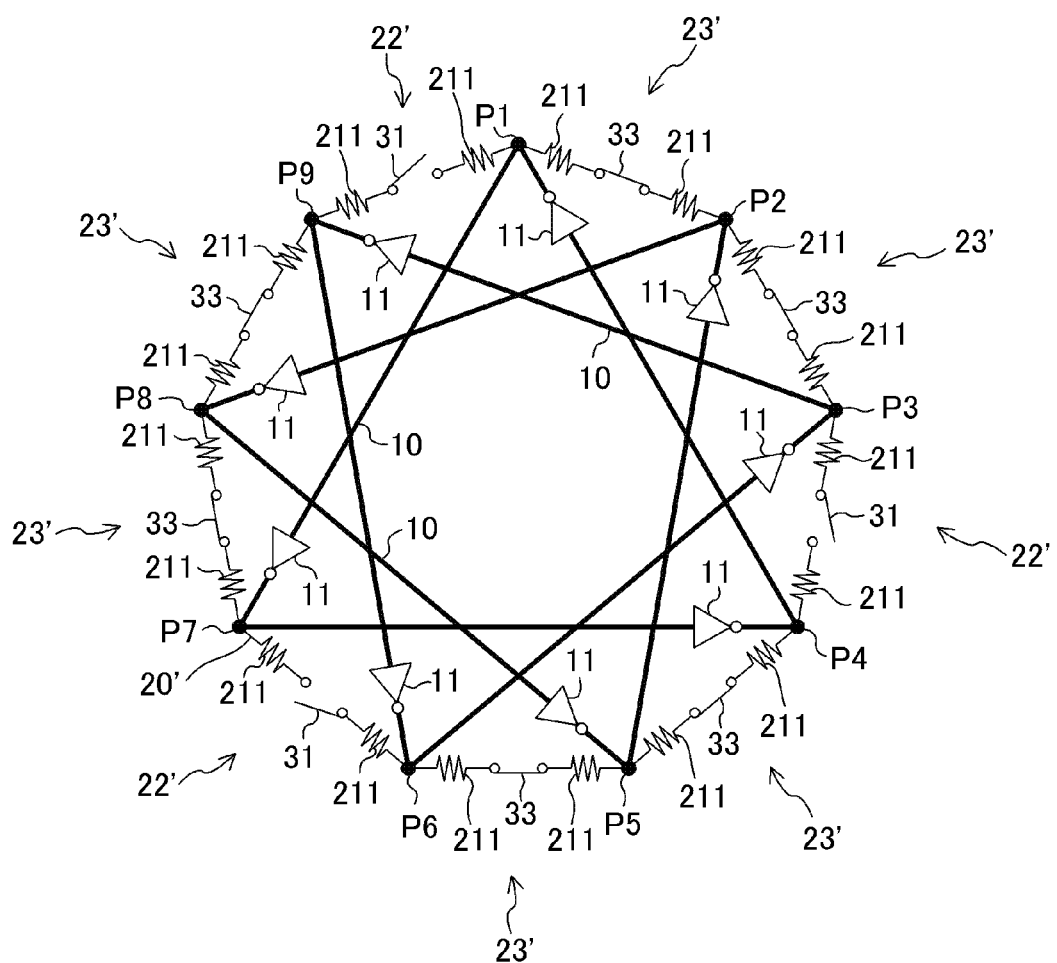
FIG. 11 is a diagram illustrating a configuration of a coupled ring oscillator according to an eighth embodiment.

FIG. 11 is a diagram illustrating a configuration of a coupled ring oscillator according to an eighth embodiment. The coupled ring oscillator of this embodiment is obtained by replacing all of the phase coupling circuits 21' in the coupled ring oscillator of the seventh embodiment (see FIG. 10) with phase coupling circuits 23'. Only differences of this embodiment from the seventh embodiment will be hereinafter described.

Each of the phase coupling circuits 23' includes a single on-state switching element 33 and resistive elements 211 each being connected to one of both ends of the switching element 33. That is, each of the phase coupling circuits 23' has the same circuit configuration as that of the phase coupling circuit 22', except that the switching elements 33 are fixed in an on state. As described above, the symmetry of the circuit is maintained by inserting the on-state switching element 33 as a dummy switch, so that a highly accurate fine phase can be generated.

Note that even when each of the phase coupling circuits 22' is configured to include only a single resistive element 211, and each of the phase coupling circuits 23' is configured to include only a single resistive element 211, similar advantages can be achieved.

Moreover, in the fifth to eighth embodiments, as a means for causing the phase coupling circuits 22, 22' to have a high impedance, besides causing the switching elements 31 to be in a non-conductive state, a resistance value may be changed to a large value.

In each of the above-described embodiments, each of the switching elements 31 and 32 can be comprised of an nMOS transistor, a pMOS transistor, a CMOS transistor, and the like. In view of the ease of switching control and the symmetry of the circuit, it is preferable that all of the switching elements 31 and 32 are transistors of the same type.

The number of the inverter circuits 11 of each of the ring oscillators 10 is not limited to three, and the number of the ring oscillators 10 of the coupled ring oscillator is not limited to three.

<<Embodiments of Application Product of Coupled Ring Oscillator>>

Figure 12:
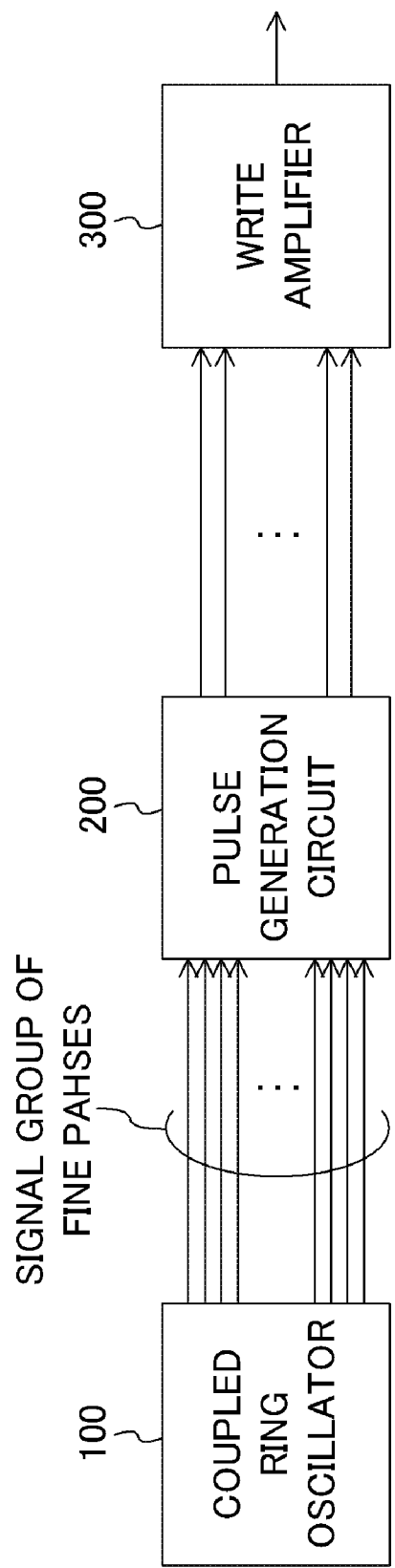
FIG. 12 is a diagram illustrating a configuration of a major part of an optical disc apparatus including a coupled ring oscillator.

FIG. 12 is a diagram illustrating a configuration of a major part of an optical disc apparatus for recording information on an optical disc medium such as a DVD, a BD, and the like. A coupled ring oscillator 100 is one of the coupled ring oscillators of the above-described embodiments. A pulse generation circuit 200 generates a write pulse for writing information on an optical disc medium (not shown) in synchronization with a signal with a fine phase generated by the coupled ring oscillator 100. A write amplifier 300 writes information on the optical disc medium (not shown) according to the write pulse generated by the pulse generation circuit 200.

When writing information on an optical disc medium such as a DVD, a BD, and the like, it is necessary to generate a write pulse based on a fine phase which is equal to or larger than one fortieth of a write data rate in order to reduce interference of a write signal. The coupled ring oscillator of one of the above-described embodiments can generate a desired highly accurate fine phase, and thus, the optical disc apparatus including the coupled ring oscillator can write information on an optical disc medium with high accuracy at high speed.

What is claimed is:

1. A coupled ring oscillator, comprising:
q ring oscillators each including p inverter circuits connected together to form a ring shape, where each of p and q is an integer of 2 or greater;
a phase coupling ring including (p×q) phase coupling circuits each of which is configured to couple an output of one of the p inverter circuits in one of the q ring oscillators to an output of one of the p inverter circuits in another one of the q ring oscillators in a predetermined phase relationship, and which are connected together to form a ring shape; and
a switching circuit configured to switch between a short-circuit state and an open-circuit state between an output of one of the p inverter circuits in each of the q ring oscillators and an output of one of the p inverter circuits in an associated one of the q ring oscillators.

2. The coupled ring oscillator of claim 1, wherein
the switching circuit is provided for each of the p inverter circuits in each of the q ring oscillators, and
the coupled ring oscillator further includes p off-state switching elements provided so that one of the p off-state switching elements is arranged between any two of the p switching circuits.

3. The coupled ring oscillator of claim 1, wherein
the switching circuit includes (q−1) switching elements configured to perform an identical open/close operation, and
each of the (q−1) switching elements is provided between an output of one of the p inverter circuits in one of the q ring oscillators and an output of one of the p inverter circuits in another one of the q ring oscillators.

4. The coupled ring oscillator of claim 2, wherein
the switching circuit includes (q−1) switching elements configured to perform an identical open/close operation, and
each of the (q−1) switching elements is provided between an output of one of the p inverter circuits in one of the q ring oscillators and an output of one of the p inverter circuits in another one of the q ring oscillators.

5. The coupled ring oscillator of claim 1, wherein
the switching circuit includes q switching elements configured to perform an identical open/close operation, and
each of the q switching elements is provided between an output of one of the p inverter circuits in each of the q ring oscillators and a common voltage node which is provided for the switching circuit.

6. The coupled ring oscillator of claim 5, further comprising:
a plurality of off-state switching elements each being provided between an output of one of the p inverter circuits in each of the q ring oscillators in which the switching circuit is not provided and the common voltage node.

7. A coupled ring oscillator, comprising:
q ring oscillators each including p inverter circuits connected together to form a ring shape, where each of p and q is an integer of 2 or greater; and
a phase coupling ring including p first phase coupling circuits and (p×(q−1)) second phase coupling circuits, each of which is configured to couple an output of one of the p inverter circuits in one of the q ring oscillators to an output of one of the p inverter circuits in another one of the q ring oscillators in phase with one another, and which are connected together to form a ring shape so that one of the first coupling circuits is inserted after every (q−1) of the second phase coupling circuits, wherein
each of the p first phase coupling circuits is configured so that an impedance of each of the p first phase coupling circuits can be switched between a normal impedance and a high impedance.

8. The coupled ring oscillator of claim 7, wherein
each of the p first phase coupling circuits includes
a resistive element, and
a switching element whose one end is connected to one end of the resistive element, and
the switching elements of the p first phase coupling circuits perform an identical open/close operation.

9. The coupled ring oscillator of claim 8, wherein
each of the (p×(q−1)) second phase coupling circuits includes
a resistive element, and
an on-state switching element connected to one end of the resistive element.

10. The coupled ring oscillator of claim 8, wherein
each of the p first phase coupling circuits further includes
a switching element which is connected to the other end of the resistive element and performs an identical open/close operation to that of the switching element connected to the one of the resistive element.

11. The coupled ring oscillator of claim 10, wherein
each of the (p×(q−1)) second phase coupling circuits includes
a resistive element, and
on-state switching elements each being connected to one of both ends of the resistive element.

12. The coupled ring oscillator of claim 7, wherein
each of the p first phase coupling circuits includes
a switching element, and
resistive elements each being connected to one of both ends of the switching element, and
the switching elements in the p first phase coupling circuits perform an identical open/close operation.

13. The coupled ring oscillator of claim 12, wherein
each of the (p×(q−1)) second phase coupling circuits includes
an on-state switching element, and
resistive elements each being connected to one of both ends of the on-state switching element.

14. The coupled ring oscillator of claim 2, wherein
the switching elements are all MOS transistors of the same polarity type.

15. The coupled ring oscillator of claim 3, wherein
the switching elements are all MOS transistors of the same polarity type.

16. The coupled ring oscillator of claim 4, wherein
the switching elements are all MOS transistors of the same polarity type.

17. The coupled ring oscillator of claim 5, wherein
the switching elements are all MOS transistors of the same polarity type.

18. The coupled ring oscillator of claim 8, wherein
the switching elements are all MOS transistors of the same polarity type.

19. The coupled ring oscillator of claim 12, wherein
the switching elements are all MOS transistors of the same polarity type.

20. An optical disc apparatus for recording information on an optical disc medium, the apparatus comprising:
the coupled ring oscillator of claim 1;
a pulse generation circuit configured to generate a write pulse for writing information on the optical disc medium in synchronization with a signal with a fine phase generated by the coupled ring oscillator; and
a write amplifier configured to write information on the optical disc medium according to the write pulse generated by the pulse generation circuit.

21. An optical disc apparatus for recording information on an optical disc medium, the apparatus comprising:
the coupled ring oscillator of claim 3;
a pulse generation circuit configured to generate a write pulse for writing information on the optical disc medium in synchronization with a signal with a fine phase generated by the coupled ring oscillator; and
a write amplifier configured to write information on the optical disc medium according to the write pulse generated by the pulse generation circuit.

22. An optical disc apparatus for recording information on an optical disc medium, the apparatus comprising:
the coupled ring oscillator of claim 4;
a pulse generation circuit configured to generate a write pulse for writing information on the optical disc medium in synchronization with a signal with a fine phase generated by the coupled ring oscillator; and
a write amplifier configured to write information on the optical disc medium according to the write pulse generated by the pulse generation circuit.

23. An optical disc apparatus for recording information on an optical disc medium, the apparatus comprising:
the coupled ring oscillator of claim 7;
a pulse generation circuit configured to generate a write pulse for writing information on the optical disc medium in synchronization with a signal with a fine phase generated by the coupled ring oscillator; and
a write amplifier configured to write information on the optical disc medium according to the write pulse generated by the pulse generation circuit.

24. An optical disc apparatus for recording information on an optical disc medium, the apparatus comprising:
the coupled ring oscillator of claim 18;
a pulse generation circuit configured to generate a write pulse for writing information on the optical disc medium in synchronization with a signal with a fine phase generated by the coupled ring oscillator; and
a write amplifier configured to write information on the optical disc medium according to the write pulse generated by the pulse generation circuit.

25. An optical disc apparatus for recording information on an optical disc medium, the apparatus comprising:
the coupled ring oscillator of claim 19;
a pulse generation circuit configured to generate a write pulse for writing information on the optical disc medium in synchronization with a signal with a fine phase generated by the coupled ring oscillator; and
a write amplifier configured to write information on the optical disc medium according to the write pulse generated by the pulse generation circuit.

26. A method for initializing a coupled ring oscillator, the coupled ring oscillator including q ring oscillators each including p inverter circuits connected together to form a ring shape, where each of p and q is an integer of 2 or greater, and a phase coupling ring including (p×q) phase coupling circuits each of which is configured to couple an output of one of the p inverter circuits in one of the q ring oscillators an output of one of the p inverter circuits in another one of the q ring oscillators in a predetermined phase relationship, and which are connected together to form a ring shape, the method comprising:

fixing, for at least one group made up of selected one of the p inverter circuits in each of the q ring oscillators, outputs of the selected ones of the q inverter circuits belonging to the at least one group in phase with one another;

causing the q ring oscillators to oscillate in the in-phase fixed state; and releasing, after causing the q ring oscillators to oscillate, the outputs of the q inverter circuits are released from the in-phase fixed state.

* * * * *